(12) United States Patent
Sawamura et al.

(10) Patent No.: US 10,882,778 B2
(45) Date of Patent: Jan. 5, 2021

(54) GLASS SUBSTRATE, LAMINATED SUBSTRATE, LAMINATE, AND METHOD FOR PRODUCING SEMICONDUCTOR PACKAGE

(71) Applicant: AGC Inc., Chiyoda-ku (JP)

(72) Inventors: Shigeki Sawamura, Tokyo (JP); Kazutaka Ono, Tokyo (JP); Yu Hanawa, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 16/018,099

(22) Filed: Jun. 26, 2018

(65) Prior Publication Data

US 2018/0305241 A1    Oct. 25, 2018

Related U.S. Application Data

(63) Continuation of application No. PCT/JP2016/088553, filed on Dec. 22, 2016.

(30) Foreign Application Priority Data

| Dec. 28, 2015 | (JP) | 2015-255887 |
| Jul. 28, 2016 | (JP) | 2016-148677 |
| Sep. 14, 2016 | (JP) | 2016-179816 |

(51) Int. Cl.

| *C03C 3/087* | (2006.01) |
| *H01L 23/15* | (2006.01) |
| *C03C 3/085* | (2006.01) |
| *H01L 21/56* | (2006.01) |
| *C03C 3/083* | (2006.01) |
| *B32B 17/00* | (2006.01) |
| *H01L 21/683* | (2006.01) |
| *H01L 23/00* | (2006.01) |

(52) U.S. Cl.
CPC ............... *C03C 3/087* (2013.01); *B32B 17/00* (2013.01); *C03C 3/083* (2013.01); *C03C 3/085* (2013.01); *H01L 21/568* (2013.01); *H01L 21/6835* (2013.01); *H01L 24/96* (2013.01); *B32B 2457/14* (2013.01); *H01L 2221/68372* (2013.01); *H01L 2224/95001* (2013.01)

(58) Field of Classification Search
CPC ......... C03C 3/083; C03C 3/085; C03C 3/087; C03C 17/00; C03C 17/10; C03C 17/23; G02B 1/10; H01L 23/15
See application file for complete search history.

(56) References Cited

U.S. PATENT DOCUMENTS

| 6,465,105 B1 | 10/2002 | Johnson et al. |
| 2013/0344343 A1 | 12/2013 | Schreder et al. |
| 2018/0222787 A1* | 8/2018 | Hanawa .................. C03C 3/087 |
| 2019/0210327 A1* | 7/2019 | Sawamura .............. B32B 17/06 |

FOREIGN PATENT DOCUMENTS

| JP | 2001-89184 | 4/2001 |
| JP | 2004-67460 | 3/2004 |
| JP | 2004067460 A * | 3/2004 |
| JP | 2004-315317 | 11/2004 |
| JP | 2004315317 A * | 11/2004 |
| JP | 2005-162520 | 6/2005 |
| JP | 2014-12630 | 1/2014 |
| WO | WO 2015/037478 A1 | 3/2015 |

OTHER PUBLICATIONS

Volf, Chemical Approach to Glass, 1984, Elsevier, vol. 7, pp. 1-13, 239-279, and 418-425. (Year: 1984).*
International Search Report dated Apr. 4, 2017 in PCT/JP2016/088553, filed on Dec. 22, 2016 ( with English Translation).
Written Opinion dated Apr. 4, 2017 in PCT/JP2016/088553, filed on Dec. 22, 2016.

* cited by examiner

*Primary Examiner* — Elizabeth A. Bolden
(74) *Attorney, Agent, or Firm* — Oblon, McClelland, Maier & Neustadt, L.L.P.

(57) ABSTRACT

A glass substrate includes, as a glass matrix composition as represented by mole percentage based on oxides, $SiO_2$: 55%-75%, $Al_2O_3$: 2%-15%, MgO: 0%-10%, CaO: 0%-10%, SrO: 0%-10%, BaO: 0%-15%, $ZrO_2$: 0%-5%, $Na_2O$: 0%-20%, $K_2O$: 5%-30%, and $Li_2O$: 0%-5.0%. The glass substrate has a total content of alkali metal oxides, as represented by mole percentage based on oxides, of 10%-30%, a value obtained by dividing the total content of alkali metal oxides by the content of $SiO_2$ of 0.50 or smaller, a value obtained by dividing the content of $Na_2O$ by a value obtained by subtracting the content of $Al_2O_3$ from a total content of $Na_2O$ and $K_2O$ of 0.90 or smaller, and an average coefficient of thermal expansion α1 at 50° C.-350° C. of 11 ppm/° C.-16 ppm/° C.

22 Claims, 1 Drawing Sheet

GLASS SUBSTRATE, LAMINATED SUBSTRATE, LAMINATE, AND METHOD FOR PRODUCING SEMICONDUCTOR PACKAGE

TECHNICAL FIELD

The present invention relates to a glass substrate, a laminated substrate, a laminate, and a process for producing a semiconductor package.

BACKGROUND ART

In the field of semiconductor devices, while the degree of integration in devices increases, size reduction in the devices is proceeding. This has resulted in a growing desire for a technique for packaging a device having a high degree of integration.

A wafer-level packaging technique in which semiconductor chips are stuck to a full-scale wafer-state glass substrate is attracting attention in recent years. As such glass substrates to be used in the technique for packaging, glass substrates for fan-out type wafer-level packaging is known (see, for example, Patent Document 1).

PRIOR ART DOCUMENT

Patent Document

Patent Document 1: International Publication WO 2015/037478

SUMMARY OF THE INVENTION

Problem that the Invention is to Solve

In the packaging technique described in Patent Document 1, semiconductor chips 22 are stuck to a supporting member 20, with an adhesive layer interposed therebetween. An encapsulating material 23 is then formed over the semiconductor chips 22. The substrate to be processed 24, which includes the semiconductor chips 22 encapsulated with the encapsulating material 23, is separated from the supporting member 20. The substrate to be processed 24 is stuck to a supporting glass substrate 26, with an adhesive layer 25 interposed therebetween.

In the fan-out type wafer-level packaging technique, a heat treatment is given to the substrate to be processed 24 which includes the resin. In Patent Document 1, the processing for forming wiring lines or solder bumps on the substrate to be processed involves a heat treatment performed at about 200° C. and, hence, the substrate to be processed undergoes a dimensional change. Patent Document 1 proposes a supporting glass substrate having an average coefficient of linear thermal expansion in the temperature range of 20° C.-200° C. of 50×10$^{-7}$/° C. or more and 66×10$^{-7}$/° C. or less, as a supporting glass substrate effective in inhibiting such dimensional change.

The coefficient of thermal expansion of an encapsulation part where semiconductor chips are embedded in an encapsulating material (resin) varies depending on the proportion of the encapsulating material (resin). An increase in the proportion of the encapsulating material hence is prone to result in a further increase in the coefficient of thermal expansion of the encapsulation part. However, there has been no glass substrate usable as a supporting member having a satisfactorily high coefficient of thermal expansion.

In case where there is a large difference in thermal expansion coefficient between the encapsulation part and the supporting member, a heat treatment causes the encapsulation part and the supporting member to have a large residual strain due to the difference in thermal expansion coefficient. At present, it is difficult for the laminated substrate including a supporting member and an encapsulation part laminated thereto to be free from failures such as deformations, damage, etc., because of a difference in thermal expansion coefficient between the encapsulation part and the supporting member. Meanwhile, there are known techniques for laminating a glass substrate to a material of another kind, besides the packaging technique described above. In cases where the material of another kind has a high coefficient of thermal expansion, failures due to a difference in thermal expansion coefficient can occur as stated above.

In view of the problem described above, the present invention, in one aspect thereof, provides a glass substrate having a high coefficient of thermal expansion, a laminated substrate in which the glass substrate is laminated, a laminate in which the glass substrate is laminated, and a process for semiconductor package production in which the glass substrate is used. In another aspect, the present invention provides a glass substrate which has a high coefficient of thermal expansion and is suitable for use as a supporting substrate for semiconductor packages, a laminated substrate in which the glass substrate is laminated, a laminate in which the glass substrate is laminated, and a process for semiconductor package production in which the glass substrate is used.

Means for Solving the Problem

A glass substrate according to one aspect of the invention is characterized by including, as a glass matrix composition as represented by mole percentage based on oxides, $SiO_2$: 55%-75%,
$Al_2O_3$: 2%-15%,
$MgO$: 0%-10%,
$CaO$: 0%-10%,
$SrO$: 0%-10%,
$BaO$: 0%-15%,
$ZrO_2$: 0%-5%,
$Na_2O$: 0%-20%,
$K_2O$: 5%-30%, and
$Li_2O$: 0%-5.0%, and having a total content of alkali metal oxides, as represented by mole percentage based on oxides, of 10%-30%;

a value obtained by dividing the total content of alkali metal oxides by the content of $SiO_2$ of 0.50 or smaller;

a value obtained by dividing the content of $Na_2O$ by a value obtained by subtracting the content of $Al_2O_3$ from a total content of $Na_2O$ and $K_2O$ of 0.90 or smaller; and an average coefficient of thermal expansion α1 at 50° C.-350° C. of 11 ppm/° C.-16 ppm/° C.

A glass substrate according to another aspect of the invention is characterized in that the glass substrate has, as represented by mole percentage based on oxides, an $SiO_2$ content of 55%-75%, a $K_2O$ content of 5%-30%, and a $Li_2O$ content of 0%-5.0%; a value obtained by dividing an $Na_2O$ content by a value obtained by subtracting an $Al_2O_3$ content from a total content of $Na_2O$ and $K_2O$ of 0.90 or smaller; and an average coefficient of thermal expansion α1 at 50° C.-350° C. of 12.0 ppm/° C.-16 ppm/° C., and that the glass substrate is a supporting substrate for semiconductor packages.

A glass substrate according to still another aspect of the invention is characterized by having a Knoop hardness of 500 or less and an average coefficient of thermal expansion α1 at 50° C.-350° C. of 11 ppm/° C.-16 ppm/° C. and by being a supporting substrate for semiconductor packages.

A glass substrate according to a further aspect of the invention is characterized by having a photoelastic constant C of 10-26 nm/cm/MPa and an average coefficient of thermal expansion α1 at 50° C.-350° C. of 11 ppm/° C.-16 ppm/° C. and by being a supporting substrate for semiconductor packages.

The laminated substrate according to the present invention includes the glass substrate of the invention and, laminated thereto, an element substrate including semiconductor chips embedded in an encapsulating material.

The laminate according to the present invention includes the glass substrate that is a component of the laminated substrate of the present invention and another glass substrate laminated thereto.

The process for semiconductor package production of the present invention is characterized by including a step in which an element substrate including a plurality of semiconductor chips embedded in an encapsulating material is formed over a first supporting substrate, thereby forming a first laminated substrate, a step in which the first laminated substrate is separated into the first supporting substrate and the element substrate, a step in which the element substrate separated from the first supporting substrate is laminated to a second supporting substrate, thereby forming a second laminated substrate, a step in which a wiring line is formed on the surface of the element substrate on the side opposite to the second supporting substrate, a step in which the second laminated substrate is separated into the second supporting substrate and the element substrate having the wiring line formed thereto, and a step in which the element substrate separated from the second supporting substrate is divided into chips respectively including the plurality of semiconductor chips of the element substrate, and the first supporting substrate and/or the second supporting substrate being the glass substrate.

In this description, each "-" used for indicating a numerical range means that the numerical values that precede and succeed the symbol are included in the range as the lower limit and the upper limit.

In this description, "%" used for indicating the content of a component in a glass substrate or in a process for production thereof is percent by mole (% by mole) on an oxide amount basis, unless otherwise indicated.

In this description, the expression "containing substantially no" used for an ingredient means that the ingredient is not contained at all or that the ingredient may be contained as an impurity which has unavoidably come into the glass during the production. Namely, that expression means that the ingredient is not contained except for the case where the ingredient is contained as an impurity which has unavoidably come into the glass during the production.

Effect of the Invention

One aspect of the present invention can provide a glass substrate having a high coefficient of thermal expansion, a laminated substrate in which the glass substrate is laminated, a laminate in which the glass substrate is laminated, or a process for semiconductor package production in which the glass substrate is used. Another aspect of the present invention can provide a glass substrate having a high coefficient of thermal expansion and suitable for use as a supporting substrate for semiconductor packages, a laminated substrate in which the glass substrate is laminated, a laminate in which the glass substrate is laminated, and a process for semiconductor package production in which the glass substrate is used.

MODES FOR CARRYING OUT THE INVENTION

One embodiments of the invention are explained below in detail.

Figure 1:
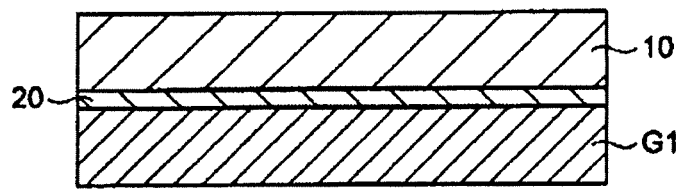
FIG. 1 is a cross-sectional view illustrating a laminated substrate which includes a glass substrate according to one embodiment of the invention and an element substrate laminated thereto.

First, one example of laminated substrates employing a glass substrate according to one embodiment of the invention is explained while refereeing to FIG. 1 and FIG. 2. The laminated substrate and production steps therefor explained below are mere examples, and the laminated substrate of the invention is not limited thereto.

FIG. 1 is a cross-sectional view of a laminated substrate 30 employing a glass substrate according to one embodiment of the invention.

The laminated substrate 30 shown in FIG. 1 includes a glass substrate G1 according to one embodiment of the invention and an element substrate 10 laminated thereto. The glass substrate G1 is used as a supporting substrate. The laminated substrate 30 may have an adhesive layer and/or a release layer between the glass substrate G1 and the element substrate 10. For example, a holding layer 20 which functions as both an adhesive layer and a release layer is formed. The element substrate 10 includes semiconductor chips (e.g., silicon chips) embedded in an encapsulating material, e.g., a resin.

For example, semiconductor chips are stuck to the glass substrate G1 according to one embodiment of the invention, with a holding layer 20 interposed therebetween. An encapsulating material is formed over the semiconductor chips to obtain an element substrate 10, in which the semiconductor chips have been embedded in the encapsulating material. For example, a resin is disposed to cover the surfaces of the semiconductor chips at a temperature of 100° C.-400° C., thereby forming an encapsulating material. Thus, a laminated substrate 30 including the glass substrate G1 and the element substrate 10 laminated thereto is obtained.

Thereafter, the laminated substrate 30 is separated into the element substrate 10 and the glass substrate G1. The separated element substrate 10 may be suitably stuck to another supporting substrate and subjected to later steps. Meanwhile, the separated glass substrate G1 is suitably regenerated and rendered usable as a supporting substrate or in other applications.

FIG. 2 is cross-sectional views illustrating one example of production steps in which a glass substrate according to one embodiment of the invention is used as a supporting substrate for a fan-out type wafer-level package.

Figure 2A:
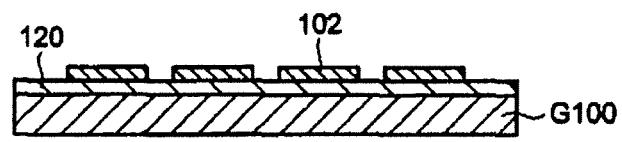
FIG. 2A to FIG. 2D are cross-sectional views illustrating an example of steps for producing a fan-out type wafer-level package, in which a glass substrate according to one embodiment of the invention is used.
Figure 2B:
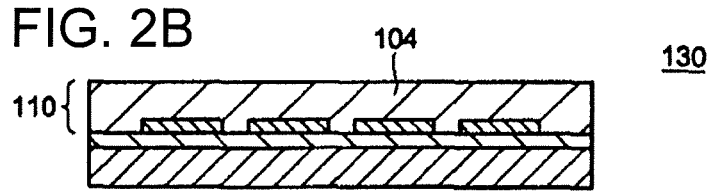

A plurality of semiconductor chips 102 are stuck to the supporting substrate (first supporting substrate) G100, with a holding layer 120 interposed therebetween (see FIG. 2A).

The holding layer 120 may be either an adhesive layer or a release layer, or may function as both an adhesive layer and a release layer. The holding layer 120 may be a single layer or composed of a plurality of layers. The holding layer 120 is constituted of, for example, a silicone resin. The semiconductor chips 102 are, for example, silicon chips. The semiconductor chips 102 are disposed so that the active surfaces thereof face the supporting substrate G100.

An encapsulating material 104 is formed over the plurality of semiconductor chips 102 so that the plurality of semiconductor chips 102 are embedded therein. Thus, a laminated substrate (first laminated substrate) 130 is obtained, in which an element substrate 110 has been laminated on the supporting substrate G100 (see FIG. 2B).

The encapsulating material 104 is formed from, for example, a resin. A resin is disposed to cover the surfaces of the plurality of semiconductor chips 102 and is then heat-treated at, for example, 100° C.-400° C., thereby obtaining an encapsulating material 104 in which the plurality of semiconductor chips 102 have been embedded.

Use of the glass substrate according to one embodiment of the invention as the supporting substrate G100 has the following advantage. As will be described later, the average coefficient of thermal expansion $\alpha 1$ at 50° C.-350° C. thereof is 11 ppm/° C.-16 ppm/° C. and the average coefficient of thermal expansion $\alpha 2$ at 30° C.-220° C. thereof is 10 ppm/° C.-15 ppm/° C., the average coefficients $\alpha 1$ and $\alpha 2$ being relatively high. Meanwhile, the element substrate 110 has a structure including semiconductor chips 102 embedded in an encapsulating material, e.g., a resin. The element substrate 110 is apt to have a relatively high average coefficient of thermal expansion, although the average coefficient depends on the proportion of the resin. For example, the epoxy resins and polyimides which are frequently used as encapsulating materials have an average coefficient of thermal expansion $\alpha$ at 100° C.-200° C. of about 30 ppm/° C. The glass substrate according to one embodiment of the invention has an average coefficient of thermal expansion $\alpha$ which is high for glass, and is hence effective in inhibiting any residual strain from generating in the laminated substrate 130 in the heat treatment step for forming an encapsulating material from a resin. The influence of the holding layer 120 disposed between the supporting substrate G100 and the element substrate 110, on the coefficients of thermal expansion is negligible because the holing layer 120 is far thinner than the supporting substrate G100 and the element substrate 110.

Figure 2C:
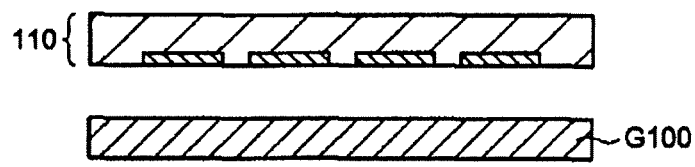
Figure 2D:
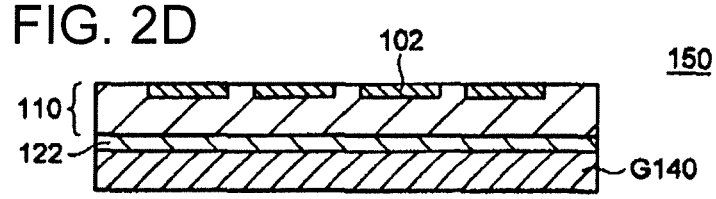

The supporting substrate G100 and the element substrate 110 are separated from each other (see FIG. 2C).

For example, the holding layer 120 is irradiated with ultraviolet light through the supporting substrate G100, thereby separating the supporting substrate G100 from the element substrate 110. The separated supporting substrate G100 may be reused as a supporting substrate, or may be utilized in other applications.

The separated element substrate 110 is stuck to a supporting substrate (second supporting substrate) G140, with a holding layer 122 interposed therebetween. Thus, a laminated substrate (second laminated substrate) 150 is obtained, in which the supporting substrate G140 has been laminated to the element substrate 110 (see FIG. 2D).

The element substrate 110 is disposed so that the active surfaces of the semiconductor chips 102 lie on a side opposite to the supporting substrate G140. The holding layer 122 may be the same as the holding layer 120.

The supporting substrate G140 may be a glass substrate according to one embodiment of the invention or another glass substrate, or may be a substrate constituted of a material other than glass (e.g., a semiconductor substrate or a metal substrate). In the case where a glass substrate according to one embodiment of the invention is used as the supporting substrate G140, a residual strain can be inhibited from generating in the laminated substrate 150 when the laminated substrate 150 is heat-treated, for example, in the step for wiring line formation which will be described later. The influence of the holding layer 122 disposed between the supporting substrate G140 and the element substrate 110 is negligible because the holing layer 122 is far thinner than the supporting substrate G140 and the element substrate 110.

Wiring lines electrically connected to the semiconductor chips 102 of the element substrate 110 are formed. Thereafter, the element substrate 110 and the supporting substrate G140 are separated from each other.

The wiring may be accomplished by forming wiring lines by disposing, for example, copper wires on the surface of the element substrate 110 on a side opposite to the surface where the supporting substrate G140 has been laminated. The separation between the element substrate 110 and the supporting substrate G140 may be conducted in the same manner as that shown in FIG. 2C. The separated supporting substrate G140 may be suitably regenerated and rendered reusable.

The separated element substrate 110 is divided into chips respectively including the semiconductor chips 102. Thus, a plurality of semiconductor devices can be obtained.

A glass substrate according to one embodiment of the invention is used as either the supporting substrate G100 or the supporting substrate G140 or as both the supporting substrate G100 and the supporting substrate G140.

First Embodiment

Next, glass substrates according to one embodiments of the invention are explained.

A glass substrate according to one embodiment of the invention has an average coefficient of thermal expansion $\alpha 1$ at 50° C.-350° C. of 11-16 ppm/° C. The $\alpha 1$ thereof is preferably higher than 11.5 ppm/° C., more preferably 11.8 ppm/° C. or higher, even more preferably 12.0 ppm/° C. or higher, especially preferably 12.5 ppm/° C. or higher, most preferably 13 ppm/° C. or higher. Meanwhile, the $\alpha 1$ thereof is preferably 15 ppm/° C. or less, more preferably 14.5 ppm/° C. or less, even more preferably 14.2 ppm/° C. or less, especially preferably 14 ppm/° C. or less.

The glass substrate according to one embodiment of the invention preferably has an average coefficient of thermal expansion $\alpha 2$ at 30° C.-220° C. of 10-15 ppm/° C. The $\alpha 2$ thereof is preferably 11.0 ppm/° C. or higher, more preferably 11.5 ppm/° C. or higher, especially preferably 12 ppm/° C. or higher. Meanwhile, the $\alpha 2$ thereof is preferably 14.5 ppm/° C. or less, more preferably 14 ppm/° C. or less.

In cases where the $\alpha 1$ at 50° C.-350° C. is within that range, this glass substrate and a resin-containing member (e.g., an element substrate including semiconductor chips) laminated thereto can be inhibited from coming to have a residual strain in a heat treatment step. Furthermore, the laminated substrate can be prevented from warping. In cases where the $\alpha 2$ at 30° C.-220° C. is within that range, the effects of inhibiting residual strain and preventing the laminated substrate from warping are more remarkably obtained.

The average coefficients of thermal expansion α1 and α2 at 50° C.-350° C. and at 30° C.-220° C. are each an average coefficient of thermal expansion determined through a measurement of thermal expansion coefficient made over the temperature range of 50° C.-350° C. or 30° C.-220° C. by the method as provided for in JIS R3102 (year 1995).

A glass substrate according to one embodiment of the invention includes, as a glass matrix composition as represented by mole percentage based on oxides, $SiO_2$: 55%-75%,
$Al_2O_3$: 2%-15%,
MgO: 0%-10%,
CaO: 0%-10%,
SrO: 0%-10%,
BaO: 0%-15%,
$ZrO_2$: 0%-5%,
$Na_2O$: 0%-20%,
$K_2O$: 5%-30%, and
$Li_2O$: 0%-5.0%, and has a total content of alkali metal oxides, as represented by mole percentage based on oxides, of 10%-30%; a value obtained by dividing the total content of alkali metal oxides by the content of $SiO_2$ of 0.50 or smaller; a value obtained by dividing the content of $Na_2O$ by a value obtained by subtracting the content of $Al_2O_3$ from a total content of $Na_2O$ and $K_2O$ of 0.90 or smaller; and an average coefficient of thermal expansion α1 at 50° C.-350° C. of 11 ppm/° C.-16 ppm/° C.

$SiO_2$ is a component which forms a network of glass. Each glass substrate of the above described embodiments hence preferably satisfies the following requirements. In cases where a content of $SiO_2$ is 55% or higher, this glass substrate has enhanced chemical resistance to acidic solutions, e.g., solutions of HCl or HF, and alkaline solutions, e.g., solutions of NaOH. In addition, this glass substrate has satisfactory heat resistance and weatherability. The content of $SiO_2$ is preferably 57% or higher, more preferably 60% or higher, especially more preferably 63% or higher, most preferably 65% or higher. Meanwhile, in cases where the content of $SiO_2$ is 75% or less, this prevents the glass from having too high melt viscosity and imparts satisfactory meltability. The satisfactory meltability enables the glass to be melted at low temperature, which reduces the amount of the fuel to be used and renders the melting furnace less apt to be damaged in the glass melting. The content of $SiO_2$ is preferably 74% or less, more preferably 73% or less, most preferably 72% or less.

In cases where a content of $Al_2O_3$ is 2% or higher, this glass substrate has enhanced chemical resistance to acidic solutions, e.g., solutions of HCl or HF, and alkaline solutions, e.g., solutions of NaOH. In addition, this glass substrate has satisfactory heat resistance and weatherability, and an increased Young's modulus. The content of $Al_2O_3$ is preferably 3.5% or higher, more preferably 4% or higher, even more preferably 4.5% or higher. Meanwhile, in cases where the content of $Al_2O_3$ is 15% or less, this prevents the glass from having too high melt viscosity and imparts satisfactory meltability. In addition, this glass substrate can have a lowered devitrification temperature and be stably formed. This glass substrate is prevented from having too high a Knoop hardness, and a high processing rate can be maintained. The content of $Al_2O_3$ is preferably 14% or less, more preferably 13% or less, even more preferably 12% or less, especially more preferably 10% or less, most preferably 7% or less.

A glass substrate according to one embodiment of the invention preferably has a total content of $SiO_2$ and $Al_2O_3$ of 60% or higher, because this glass substrate has enhanced chemical resistance to acidic solutions and alkaline solutions. The total content of $SiO_2$ and $Al_2O_3$ is more preferably 62% or higher, even more preferably 63% or higher, especially preferably 65% or higher. Meanwhile, in cases where the total content of $SiO_2$ and $Al_2O_3$ is 80% or less, this glass shows satisfactory meltability to have moderate melt viscosity and this glass substrate is prevented from having too low a coefficient of thermal expansion. Such total content values are hence preferred. In addition, this glass substrate is prevented from having too high a Knoop hardness and a high processing rate can be maintained. The total content of $SiO_2$ and $Al_2O_3$ is more preferably 79% or less, even more preferably 78% or less, especially preferably 77% or less, most preferably 74% or less.

MgO is not an essential component. However, in cases where MgO is contained, this prevents the glass from having too high melt viscosity and imparts satisfactory meltability. It is hence preferable that MgO is contained. In cases where MgO is contained, this glass substrate has improved weatherability and an increased Young's modulus. A content of MgO is preferably 0.5% or higher, more preferably 1% or higher, even more preferably 2% or higher, even more preferably 3% or higher, especially more preferably 4% or higher, most preferably 5% or higher. From the standpoint of devitrification, the content of MgO is 10% or less, preferably 8% or less, more preferably 7% or less, even more preferably 5% or less.

CaO is not an essential component. However, in cases where CaO is contained, this prevents the glass from having too high melt viscosity and imparts satisfactory meltability. In addition, this glass substrate has improved weatherability and chemical resistance to acidic solutions, e.g., solutions of HCl or HF, and alkaline solutions, e.g., solutions of NaOH. Consequently, a content of CaO is preferably 0.5% or higher, more preferably 1% or higher, even more preferably 2% or higher, especially more preferably 3% or higher. From the view point of devitrification resistance, the content of CaO is 10% or less, preferably 9% or less, more preferably 7% or less.

SrO is not an essential component. However, in cases where SrO is contained, this prevents the glass from having too high melt viscosity and imparts satisfactory meltability. In addition, this glass substrate has improved weatherability and the coefficient of thermal expansion can be heighten. SrO also has an effect of lowering a photoelastic constant. Consequently, a content of SrO is preferably 0.5% or higher, more preferably 1% or higher, even more preferably 2% or higher, especially more preferably 3% or higher. From the view point of devitrification resistance, the content of SrO is 10% or less, preferably 9% or less, more preferably 7% or less.

BaO is not an essential component. However, in cases where BaO is contained, this prevents the glass from having too high melt viscosity and imparts satisfactory meltability. In addition, the coefficient of thermal expansion can be heighten. BaO also has an effect of lowering a photoelastic constant. Consequently, a content of BaO is preferably 0.5% or higher, more preferably 1% or higher, even more preferably 2% or higher, especially more preferably 3% or higher, most preferably 5% or higher. Meanwhile, the glass has a high specific gravity to get the glass heavy. Consequently, the content of BaO is 15% or less, preferably 10% or less, more preferably 9% or less, especially more preferably 7% or less.

In a glass substrate according to one embodiment of the invention, a total content of MgO, CaO, SrO, and BaO is preferably 0.1-20%. In cases where the total content thereof is within that range, this glass shows satisfactory meltability to have moderate melt viscosity and the glass substrate has improved weatherability. The total content of MgO, CaO, SrO, and BaO is preferably 0.5% or higher, more preferably 4% or higher, even more preferably 5% or higher. Meanwhile, in cases where the total content of MgO, CaO, SrO, and BaO is 20% or less, this glass substrate has enhanced chemical resistance to acidic solutions, e.g., solutions of HCl or HF, and alkaline solutions, e.g., solutions of NaOH. In addition, this glass substrate can have a lowered devitrification temperature and be stably formed. The total content of MgO, CaO, SrO, and BaO is preferably 20% or less, more preferably 18% or less, especially preferably 10% or less.

$ZrO_2$ is not an essential component. However, in cases where $ZrO_2$ is contained, the chemical resistance of the glass is improved. A content of $ZrO_2$ hence is preferably 0.2% or higher, more preferably 0.5% or higher, even more preferably 1% or higher. Meanwhile, too high contents thereof may not only arouse a trouble that some of the $ZrO_2$ remains unmelted during melting but also result in an increase in devitrification temperature, etc., thereby impairing the producibility. Consequently, the content of $ZrO_2$ is 5% or less, preferably 4% or less, more preferably 3% or less, even more preferably 2% or less.

$Na_2O$ is not an essential component. However, in cases where $Na_2O$ is contained, the viscosity of the molten glass is lowered. Furthermore, $Na_2O$ can remarkably heighten the coefficient of thermal expansion. Consequently, a content of $Na_2O$ is desirably 3% or higher, preferably 4% or higher, more preferably 5% or higher, even more preferably 6% or higher, especially preferably 7% or higher, most preferably 9% or higher. Meanwhile, in cases where the content of $Na_2O$ is 20% or less, the thermal expansion can be enhanced without lowering the weatherability. The content of $Na_2O$ is preferably 18% or less, more preferably 17% or less, even more preferably 16% or less, especially preferably 15% or less.

$K_2O$ is a component which lowers the viscosity of the molten glass. Furthermore, $K_2O$ can remarkably heighten the coefficient of thermal expansion. A content of $K_2O$ is 5% or higher, preferably 6% or higher, more preferably 7% or higher, even more preferably 8% or higher, especially preferably 9% or higher, most preferably 10% or higher. Meanwhile, in cases where the content of $K_2O$ is 30% or less, the coefficient of thermal expansion can be heightened without impairing the weatherability and the chemical resistance, e.g., acid resistance. The content of $K_2O$ is preferably 28% or less, more preferably 25% or less, even more preferably 20% or less, especially preferably 19% or less.

$Li_2O$ is not an essential component. However, in cases where $Li_2O$ is contained, the coefficient of thermal expansion can be heighten. Meanwhile, in cases where a content of $Li_2O$ is 5.0% or less, the coefficient of thermal expansion can be heightened without arousing a trouble that ion migration reduces reliability. Li ions have a small ionic radius, and there is the high possibility that Li ions might migrate from the glass substrate to the wiring line layer or silicon chips during various heat treatments. Consequently, the content of $Li_2O$ is preferably 4% or less, more preferably 2% or less.

A glass substrate according to one embodiment of the invention has a total content of alkali metal oxides ($R_2O$ (R is an alkali metal, e.g., Li, Na, or K)) of 10%-30%. Examples of the alkali metal oxides include $Li_2O$, $Na_2O$, and $K_2O$. $Na_2O$ and $K_2O$ are preferred. The total content of alkali metal oxides is preferably 15% or higher, more preferably 17% or higher, especially preferably 20% or higher. Meanwhile, the total content of alkali metal oxides is preferably 26% or less, more preferably 25% or less, especially preferably 23% or less.

In a glass substrate according to one embodiment of the invention, a total content of $Na_2O$ and $K_2O$ is preferably 10%-30%. In cases where the total content thereof is within that range, the coefficient of thermal expansion can be heightened to a desired value. By regulating the total content thereof to 30% or less, a glass substrate having high chemical resistance can be provided. The total content of $Na_2O$ and $K_2O$ is preferably 15% or higher, more preferably 17% or higher, especially preferably 20% or higher. Meanwhile, the total content of $Na_2O$ and $K_2O$ is preferably 26% or less, more preferably 25% or less, especially preferably 23% or less.

In a glass substrate according to one embodiment of the invention, a value obtained by dividing the total content of alkali metal oxides by the content of $SiO_2$ ($R_2O/SiO_2$) is 0.50 or smaller, preferably 0.4 or smaller, more preferably 0.35 or smaller. By regulating the $R_2O/SiO_2$ to 0.5 or smaller, the glass substrate is made to have satisfactory weatherability. From the standpoint of heightening the coefficient of thermal expansion, the $R_2O/SiO_2$ is preferably 0.05 or larger, more preferably 0.1 or larger.

In a glass substrate according to one embodiment of the invention, a value obtained by dividing the content of $Na_2O$ by a value obtained by subtracting the content of $Al_2O_3$ from the total content of $Na_2O$ and $K_2O$ [$Na_2O/(Na_2O+K_2O—Al_2O_3)$] is 0.90 or smaller, preferably 0.80 or smaller, more preferably 0.70 or smaller. In cases where the [$Na_2O/(Na_2O+K_2O—Al_2O_3)$] is 0.90 or smaller, the coefficient of thermal expansion can be significantly heightened.

Inclusion of $Al_2O_3$ in a glass is effective in diminishing non-crosslinking oxygen atoms to improve the weatherability but tends to lower the coefficient of thermal expansion. It is therefore preferred to optimize alkali species combining with non-crosslinking oxygen atoms and to thereby heighten the coefficient of thermal expansion. Examples of the alkali species include Na and K. Compared to K, Na has a high electric-field strength and is hence less effective in improving the coefficient of thermal expansion. Because an alkali oxide amount effective in yielding non-crosslinking oxygen atoms corresponds to [$Na_2O+K_2O—Al_2O_3$], the proportion of $Na_2O$ to [$Na_2O+K_2O—Al_2O_3$] is preferably smaller from the standpoint of heightening the coefficient of thermal expansion. From the standpoint of preventing the weatherability from becoming worse, the [$Na_2O/(Na_2O+K_2O—Al_2O_3)$] is preferably 0.1 or larger, more preferably 0.2 or larger.

A glass substrate according to one embodiment of the invention may contain $B_2O_3$. In cases where $B_2O_3$ is contained, this prevents the glass from having too high melt viscosity and imparts satisfactory meltability. Furthermore, $B_2O_3$ enables the glass to have a lowered devitrification temperature and be stably formed. In addition, $B_2O_3$ brings about an increased Young's modulus, making it possible to inhibit the glass substrate from warping or cracking in the annealing step in producing the glass substrate. A content of $B_2O_3$ is preferably 1% or higher, more preferably 2% or higher. Meanwhile, $B_2O_3$ is a component which lowers the coefficient of thermal expansion and, hence, the content of $B_2O_3$ is preferably 5% or less, more preferably 4% or less, especially preferably 3% or less, most preferably substantially nil.

A glass substrate according to one embodiment of the invention may contain one or more ingredients selected from among $SnO_2$, $SO_3$, Cl, and F. Inclusion of $SnO_2$, $SO_3$, Cl, and F is effective in inhibiting bubbling during glass substrate production, thereby yielding a glass substrate containing few bubbles.

A glass substrate according to one embodiment of the invention may contain ZnO in order to regulate the viscosity and the average coefficient of thermal expansion. In cases where ZnO is contained, the content thereof is preferably 2% or less, more preferably 1% or less, especially preferably 0.5% or less.

A glass substrate according to one embodiment of the invention may contain one or more ingredients selected from among $Y_2O_3$, $La_2O_3$, and $TiO_2$, in order to improve the chemical resistance and Young's modulus of the glass substrate. However, a total content thereof is preferably 2% or less, more preferably 1% or less, especially preferably 0.5% or less.

A glass substrate according to one embodiment of the invention may contain a reducing agent in order to heighten the ultraviolet light transmittance. Examples of the reducing agent include carbon and coke. In cases where one or more reducing agents are contained, the total content thereof is preferably 2% or less, more preferably 1% or less, especially preferably 0.5% or less, most preferably 0.2% or less.

A glass substrate according to one embodiment of the invention preferably contains substantially none of $V_2O_5$, $P_2O_5$, $CeO_2$, $Y_2O_3$, $La_2O_3$, and $TiO_2$ from the standpoints of striae, coloration, etc.

A glass substrate according to one embodiment of the invention preferably contains substantially neither $As_2O_3$ nor $Sb_2O_3$ from the standpoint of environmental burden. The glass substrate preferably contains substantially no ZnO from the standpoint of stably conducting float-process forming.

In a glass substrate according to one embodiment of the invention, the following expression (1), which shows a relationship among the contents of oxides, preferably has a value of 110-160.

$$0.507\times(\text{content of SiO}_2)-1.112\times(\text{content of Al}_2\text{O}_3)+0.709\times(\text{content of MgO})+0.534\times(\text{content of CaO})-0.108\times(\text{content of SrO})+1.832\times(\text{content of BaO})+4.083\times(\text{content of Na}_2\text{O})+4.449\times(\text{content of K}_2\text{O})-4.532\times(\text{content of ZrO}_2) \quad (1)$$

Expression (1) is a regression expression which indicates a relationship between the glass composition and the average coefficient of thermal expansion $\alpha 1$ at 50° C.-350° C. This regression expression was obtained by determining the average coefficients of thermal expansion $\alpha 1$ at 50° C.-350° C. of about a hundred glasses differing in $SiO_2$ content, $Al_2O_3$ content, MgO content, CaO content, SrO content, BaO content, $Na_2O$ content, $K_2O$ content, and $ZrO_2$ content. In cases where the value of expression (1) is 110-160, it is easy to regulate the average coefficient of thermal expansion $\alpha 1$ at 50° C.-350° C. to a value in the range of 11 ppm/° C.-16 ppm/° C.

The value of expression (1) is preferably 115 or larger, more preferably 118 or larger, even more preferably 120 or larger, especially preferably 125 or larger. Meanwhile, in cases where the value of expression (1) is 160 or less, it is easy to perform a heat treatment so that only a slight residual strain occurs in the laminated substrate. The value of expression (1) is preferably 150 or less, more preferably 145 or less, even more preferably 142 or less, especially preferably 140 or less.

In a glass substrate according to one embodiment of the invention, the following expression (2), which shows a relationship among the contents of oxides, preferably has a value of 100-150.

$$1.135\times(\text{content of SiO}_2)-0.741\times(\text{content of Al}_2\text{O}_3)+2.080\times(\text{content of MgO})+0.293\times(\text{content of CaO})-1.307\times(\text{content of SrO})+1.242\times(\text{content of BaO})+2.056\times(\text{content of Na}_2\text{O})+2.464\times(\text{content of K}_2\text{O})-2.982\times(\text{content of ZrO}_2) \quad (2)$$

Expression (2) is a regression expression which indicates a relationship between the glass composition and the average coefficient of thermal expansion $\alpha 2$ at 30° C.-220° C. This regression expression was obtained in the same manner as for regression expression (1) described above, which indicates a relationship between the glass composition and the average coefficient of thermal expansion $\alpha 1$ at 50° C.-350° C. The measurement for determining the average coefficient of thermal expansion was made over the temperature range of 30° C.-220° C. In cases where the value of expression (2) is 100-150, it is easy to regulate the average coefficient of thermal expansion $\alpha 2$ at 30° C.-220° C. to a value in the range of 10 ppm/° C.-15 ppm/° C.

The value of expression (2) is preferably 102 or larger, more preferably 110 or larger, even more preferably 115 or larger, especially preferably 120 or larger. Meanwhile, in cases where the value of expression (2) is 150 or less, it is easy to perform a heat treatment so that only a slight residual strain occurs in the laminated substrate. The value of expression (2) is preferably 145 or less, more preferably 140 or less.

There are cases where a holding layer (release layer) which is separated with ultraviolet light is disposed between a glass substrate according to one embodiment of the invention and an element substrate. In this case, the glass substrate is removed from the laminated substrate by irradiating the holding layer with ultraviolet light through the glass substrate.

A glass substrate according to one embodiment of the invention, when having a thickness of 1 mm, preferably has a transmittance at 360-nm wavelength of 15% or higher. In cases where the transmittance of the glass substrate at 360-nm wavelength is 15% or higher, this glass substrate can be easily removed from the laminated substrate by irradiation with ultraviolet light. The transmittance of the glass substrate at 360-nm wavelength is more preferably 20% or higher, even more preferably 25% or higher, especially preferably 30% or higher.

A glass substrate according to one embodiment of the invention desirably has a devitrification temperature lower than 1,150° C. In cases where the devitrification temperature thereof is lower than 1,150° C., stable forming is possible. The devitrification temperature thereof is preferably 1,100° C. or lower, more preferably 1,050° C. or lower, even more preferably 1,030° C. or lower, especially preferably 1,000° C. or lower, most preferably 980° C. or lower. Lower devitrification temperatures bring about satisfactory producibility and indicate satisfactory glass stability in glass production. The devitrification temperature of a glass is determined by placing crushed particles of the glass on a platinum dish, heat-treating the particles for 17 hours in an electric furnace controlled so as to have a constant temperature, examining the heat-treated glass with an optical microscope to determine a highest temperature at which crystal precipitation occurs in neither the glass surface nor the inside thereof, and taking the highest temperature as the devitrification temperature.

A glass substrate according to one embodiment of the invention preferably has a devitrification viscosity ($\eta_{TL}$) of $10^{3.8}$ d·Pa·s or higher. In cases where the devitrification viscosity thereof is $10^{3.8}$ d·Pa·s or higher, stable forming is possible. The devitrification viscosity thereof is more preferably $10^{4.0}$ d·Pa·s or higher, even more preferably $10^{4.2}$ d·Pa·s or higher.

A glass substrate according to one embodiment of the invention preferably has an $Fe_2O_3$ content higher than 200 ppm but not higher than 1,000 ppm, as represented by mass per million based on oxides, from the standpoint of making the glass substrate have an increased thermal conductivity and satisfactory meltability. In cases where the content of $Fe_2O_3$ exceeds 200 ppm, the glass substrate can have an increased thermal conductivity and satisfactory meltability. In cases where the content of $Fe_2O_3$ is 1,000 ppm or less, the glass substrate is less apt to absorb visible light and to take a color. The content of $Fe_2O_3$ is more preferably 300 ppm or higher, even more preferably 400 ppm or higher, especially preferably 500 ppm or higher. The content of $Fe_2O_3$ is more preferably 800 ppm or less, even more preferably 700 ppm or less, especially preferably 600 ppm or less.

A glass substrate according to one embodiment of the invention preferably is one in which the proportion by mass (%) of divalent iron in terms of $Fe_2O_3$ to total iron in terms of $Fe_2O_3$ (hereinafter, the proportion is referred to as Fe-Redox) is 20% or higher. In cases where the Fe-Redox is 20% or higher, the glass substrate has a heightened transmittance at wavelengths of 400-nm or shorter. As a result, a larger amount of ultraviolet light strikes on the release layer through the glass substrate to enable the glass substrate to be easily removed from the laminated substrate. The Fe-redox is more preferably 25% or higher, even more preferably 30% or higher, especially preferably 40% or higher.

A glass substrate according to one embodiment of the invention preferably has a Young's modulus of 60 GPa or higher. The value of Young's modulus is determined by an ultrasonic pulse method. In cases where the Young's modulus thereof is 60 GPa or higher, the glass substrate can be inhibited from warping or cracking in the annealing step in producing the glass substrate. In addition, this glass substrate can be inhibited from being damaged by contact with semiconductor chips or by contact with a peripheral member when the glass substrate is conveyed. The Young's modulus thereof is more preferably 62 GPa or higher, even more preferably 65 GPa or higher. The Young's modulus thereof is preferably 80 GPa or less. In cases where the Young's modulus thereof is 80 GPs or less, the glass is inhibited from being brittle, and the glass substrate can be inhibited from chipping during cutting. The Young's modulus thereof is more preferably 75 GPa or less, even more preferably 72 GPa or less.

A glass substrate according to one embodiment of the invention preferably has a thickness of 2.0 mm or less. In cases where the thickness thereof is 2.0 mm or less, a laminated substrate including this glass substrate and semiconductor chips stuck thereto can have a reduced size. The thickness of the glass substrate is more preferably 1.5 mm or less, even more preferably 1.0 mm or less, especially preferably 0.8 mm or less. The thickness of the glass substrate is preferably 0.1 mm or larger. In cases where the thickness thereof is 0.1 mm or larger, this glass substrate can be inhibited from being damaged by contact with semiconductor chips or by contact with a peripheral member when the glass substrate is conveyed. In addition, such a thickness can inhibit the glass substrate from being bent by its own weight. The thickness thereof is more preferably 0.2 mm or larger, even more preferably 0.3 mm or larger.

A glass substrate according to one embodiment of the invention preferably is one in which one main surface has an area of 30 $cm^2$-4,500 $cm^2$. In cases where the area of the glass substrate is 30 $cm^2$ or larger, a large number of semiconductor chips can be disposed thereon, making it possible to obtain a larger number of semiconductor devices later by dividing the laminated substrate. An improvement in production efficiency is hence attained. The area of the glass substrate is more preferably 70 $cm^2$ or larger, even more preferably 170 $cm^2$ or larger, especially preferably 300 $cm^2$ or larger, most preferably 700 $cm^2$ or larger. In cases where the area of the glass substrate is 4,500 $cm^2$ or less, this glass substrate is easy to handle. In addition, this glass substrate can be inhibited from being damaged by contact with semiconductor chips to be stuck thereto or by contact with a peripheral member when the glass substrate is conveyed. The area of the glass substrate is more preferably 3,500 $cm^2$ or less, even more preferably 2,500 $cm^2$ or less, especially preferably 1,700 $cm^2$ or less, most preferably 800 $cm^2$ or less.

A glass substrate according to one embodiment of the invention is not particularly limited in the shape thereof. The glass substrate may be circular or rectangular, and may have a notch or orientation flat formed in the edge thereof. In the case of a circular shape, some of the periphery may be straight. The term "circular" means a shape that is not limited to a complete circle and that may be a circle in which the dimensional deviations from a complete circle having the same diameter are up to 50 µm. In the case where the glass substrate is circular, this glass substrate can be satisfactorily conveyed in equipment where existing semiconductor substrates are handled, since the shape of this glass substrate is the same as or similar to the shapes of the existing semiconductor substrates. Circular shapes are hence preferred. In the case where the glass substrate is rectangular, semiconductor chips can be disposed thereon without leaving wasteful spaces between the semiconductor chips. As a result, the number of semiconductor devices to be obtained can be increased. Rectangular shapes are hence preferred.

In the case where a glass substrate according to one embodiment of the invention is circular, this glass substrate preferably has a diameter of 7 cm or larger. In cases where the diameter thereof is 7 cm or larger, many semiconductor devices can be obtained from a laminated substrate including this glass substrate and an element substrate, resulting in an improvement in production efficiency. The diameter thereof is more preferably 10 cm or larger, even more preferably 15 cm or larger, especially preferably 20 cm or larger, most preferably 25 cm or larger. The diameter thereof is preferably 50 cm or less. In cases where the diameter thereof is 50 cm or less, this glass substrate is easy to handle. The diameter thereof is more preferably 45 cm or less, even more preferably 40 cm or less, especially preferably 35 cm or less.

In the case where a glass substrate according to one embodiment of the invention is rectangular, a dimension of each side is preferably 30 cm or larger, more preferably 40 cm or larger, even more preferably 50 cm or larger, especially preferably 60 cm or larger. Rectangular shapes are preferred. In the case of a rectangular shape, the dimension of each shorter side is preferably as shown above, and the dimension of each longer side is preferably 40 cm or larger, more preferably 50 cm or larger, even more preferably 60 cm or larger, especially preferably 70 cm or larger.

A glass substrate according to one embodiment of the invention preferably has a density of 3.00 g/cm³ or less. In cases where the density thereof is 3.00 g/cm³ or less, this glass substrate is lightweight and easy to handle. In addition, this glass substrate can be made less apt to be bent by its own weight. The density thereof is more preferably 2.80 g/cm³ or less, even more preferably 2.70 g/cm³ or less. The density thereof is preferably 2.30 g/cm³ or higher. In cases where the density thereof is 2.30 g/cm³ or higher, this glass can have a heightened hardness (e.g., Knoop hardness or Vickers hardness), rendering the glass surface less apt to receive scratches. The density thereof is more preferably 2.35 g/cm³ or higher, especially preferably 2.40 g/cm³ or higher.

A glass substrate according to one embodiment of the invention preferably has a β-OH of 0.05 mm⁻¹-0.65 mm⁻¹. β-OH is an index to the water content of the glass substrate according to one embodiment of the invention. By regulating the β-OH to 0.05 mm⁻¹ or higher, bubbling can be inhibited in glass substrate production, thereby yielding a glass substrate containing few bubbles. The β-OH thereof is more preferably 0.1 mm⁻¹ or higher, even more preferably 0.15 mm⁻¹ or higher, especially preferably 0.17 mm⁻¹ or higher. Meanwhile, by regulating the β-OH to 0.65 mm⁻¹ or less, the heat resistance can be enhanced. The β-OH thereof is more preferably 0.55 mm⁻¹ or less, even more preferably 0.5 mm⁻¹ or less, especially preferably 0.45 mm⁻¹ or less. The values of β-OH were determined by the following equation.

$$\beta\text{-OH}(mm^{-1}) = -\log_{10}(T_{3500}\,cm^{-1}/T_{4000}\,cm^{-1})/t$$

In the equation, $T_{3500}\,cm^{-1}$ is the transmittance (%) of light having a wave number of 3,500 cm⁻¹, $T_{4000}\,cm^{-1}$ is the transmittance (%) of light having a wave number of 4,000 cm⁻¹, and t is the thickness (mm) of the glass substrate.

A glass substrate according to one embodiment of the invention may have a thin film (hereinafter referred to also as barrier film) having a thickness of 0.1 nm-1,000 nm and serving as a barrier to alkali metal components such as Li, Na, and K, on a surface of the glass substrate. Examples of the barrier film include single-layer films selected from among silicon oxide films, silicon nitride films, silicon oxy-nitride films, aluminum oxide films, zirconium oxide films, titanium oxide films, tantalum oxide films, and magnesium fluoride films and multilayer films each composed of two or more of these films. For depositing the barrier film, a known method can be used. Examples thereof include sputtering, CVD, vapor deposition, sol-gel method, and atomic layer deposition (ALD). By forming the barrier film, alkali metal components such as Li, Na, and K can be prevented from dissolving away and the substrate surface can be inhibited from altering (scorching).

A glass substrate according to one embodiment of the invention preferably has a light-shielding film on at least one main surface of the glass substrate. In cases where the glass substrate has a light-shielding film formed on the main surface thereof, it is easy to detect the position of the glass substrate or laminated substrate in the step of inspecting the glass substrate or laminated substrate. The position of the glass substrate or laminated substrate is determined by detecting reflected light caused by irradiating the glass substrate or laminated substrate with light. Glass substrates are prone to transmit light. By forming a light-shielding film on a main surface of the glass substrate, the reflected light is intensified to facilitate the detection of the position. The light-shielding film preferably contains Ti.

A glass substrate according to one embodiment of the invention preferably has a glass transition temperature (referred to also as Tg) of preferably 420° C. or higher. In cases where the Tg thereof is 420° C. or higher, this glass substrate can be inhibited from dimensionally changing in a heat treatment step. The Tg thereof is more preferably 440° C. or higher, even more preferably 460° C. or higher, especially preferably 480° C. or higher.

A glass substrate according to one embodiment of the invention preferably has a viscosity of 10² d·Pa·s at a temperature (hereinafter referred to also as $T_2$) of 1,500° C. or lower. In cases where the $T_2$ is 1,500° C. or lower, this glass shows satisfactory meltability. The $T_2$ is more preferably 1,450° C. or lower, even more preferably 1,400° C. or lower, especially preferably 1,380° C. or lower.

A glass substrate according to one embodiment of the invention preferably has a viscosity of 10⁴ d·Pa·s at a temperature (hereinafter referred to also as $T_4$) of 1,100° C. or lower. In cases where the $T_4$ is 1,100° C. or lower, this glass shows satisfactory formability. The $T_4$ is more preferably 1,050° C. or lower, even more preferably 1,025° C. or lower, especially preferably 1,000° C. or lower.

A glass substrate according to one embodiment of the invention may have been chemically strengthened. The chemically strengthened glass substrate has improved strength and can be prevented from being damaged by contact, etc.

A glass substrate according to one embodiment of the invention may have undergone no chemical strengthening. The glass substrate which has not been chemically strengthened can be significantly prevented from warping.

Next, a laminate according to one embodiment of the invention is explained.

The laminate according to one embodiment of the invention is formed by sticking another glass substrate to the glass substrate which is a component of the laminated substrate. In the case where a laminated substrate according to one embodiment of the invention is used, for example, as a support glass for semiconductor back grinding, the glass substrate is ground after having been stuck to the silicon substrate, in order to reduce the thickness of the laminated substrate.

The laminate according to one embodiment of the invention has an advantage in that since this laminate has been formed by sticking a glass substrate to the glass substrate which is a component of the laminated substrate, the thickness of the laminate can be reduced by removing the former glass substrate in place of grinding the latter glass substrate. For example, as compared with a laminated substrate including a glass substrate having any thickness, a laminate including two glass substrates each having a thickness one-half the thickness of said glass substrate has an advantage in that the thickness thereof can be made smaller than the thickness of the laminated substrate, without grinding, by removing one of the glass substrates. Meanwhile, a laminated substrate including a glass substrate having any thickness has a deflection amount larger than the deflection amount of a laminate obtained by laminating two glass substrates each having a thickness one-half the thickness of said glass substrate. By forming a laminate by laminating a desired number of glass substrates each having a desired thickness, the laminate can be made to have a reduced deflection amount.

A process for producing a glass substrate according to one embodiment of the invention is explained below.

The glass substrate according to one embodiment of the invention is produced through the steps of melting, refining, forming, annealing, and cutting.

In the melting step, raw materials are prepared so as to result in a desired glass composition, and the raw materials are introduced into a melting furnace and heated to preferably about 1,450° C.-1,650° C., thereby obtaining a molten glass.

As the raw materials, use may be made of oxides, carbonates, nitrates, and hydroxides. Other materials including halides such as chlorides are also usable. In cases where the process includes a step in which the molten glass comes into contact with platinum as in the melting step or refining step, fine platinum particles may come into the molten glass and be included as foreign matter in the glass substrate obtained. Nitrates have the effect of preventing the inclusion of platinum as foreign matter and, hence, use thereof as raw materials is preferred. Usable as the nitrates are strontium nitrate, barium nitrate, magnesium nitrate, calcium nitrate, and the like. More preferred is to use strontium nitrate. With respect to the particle sizes of the raw materials, use may be suitably made of raw materials ranging from raw materials having such a large particle diameter of several hundred micrometers that the particles do not remain unmelted to raw materials having such a small particle diameter of several micrometers that the particles neither fly off during raw-material conveyance nor aggregate into secondary particles. Use of granules is possible. The water contents of the raw materials can be suitably regulated in order to prevent the raw materials from flying off. Melting conditions including β-OH and the degree of oxidation/reduction of Fe or Redox [$Fe^{2+}/(Fe^{2+}+Fe^{3+})$] can also be suitably regulated.

In the refining step, a method of degassing under reduced pressure may be applied. For producing the glass substrate according to one embodiment of the invention, $SO_3$ or $SnO_2$ can be used as a refining agent. Preferred $SO_3$ sources are the sulfates of at least one element selected from among Al, Mg, Ca, Sr, and Ba. More preferred are the sulfates of alkaline earth metals. Preferred of these are $CaSO_4.2H_2O$, $SrSO_4$, and $BaSO_4$, because these sulfates are highly effective in enlarging bubbles. As a refining agent for the method of degassing performed under reduced pressure, it is preferred to use a halogen such as Cl or F. Preferred Cl sources are the chlorides of at least one element selected from among Al, Mg, Ca, Sr, and Ba. More preferred are the chlorides of alkaline earth metals. Especially preferred of these are $SrCl_2.6H_2O$ and $BaCl_2.2H_2O$, because these chlorides are highly effective in enlarging bubbles and have low deliquescence. Preferred F sources are the fluorides of at least one element selected from among Al, Mg, Ca, Sr, and Ba. More preferred are the fluorides of alkaline earth metals. Even more preferred of these is $CaF_2$, because this fluoride is highly effective in enhancing the meltability of raw glass materials.

In the forming step, the float process is used in which the molten glass is poured onto a molten metal to obtain a plate-shaped glass ribbon.

In the annealing step, the glass ribbon is annealed.

In the cutting step, the glass ribbon after the annealing is cut into a given size to obtain a glass substrate.

The present invention is not limited to the embodiments described above. Modifications, improvements, and the like made within a range where the objects of the invention can be achieved are included in the invention.

For example, in the case of producing a glass substrate according to one embodiment of the invention, use may be made of the fusion process, press forming, or the like in the forming step to form the molten glass into a plate shape.

A platinum crucible may be used in producing a glass substrate according to one embodiment of the invention. In the case of using a platinum crucible, the melting step may be performed in the following manner. Raw materials are prepared so as to result in the composition of the glass substrate to be obtained, and the platinum crucible containing the raw materials is introduced into an electric furnace. The raw materials are heated to preferably about 1,450° C.-1,650° C., and a platinum stirrer is inserted thereinto to stir the contents for 1-3 hours, thereby obtaining a molten glass.

The glass substrate obtained by the cutting may be heated, for example, to a temperature higher by about 50° C. than the Tg and then gradually cooled to a room-temperature state. Thus, the residual strain in the glass substrate can be removed.

A glass substrate according to one embodiment of the invention may be used as a glass substrate having a through-hole (glass interposer; GIP). In a through glass via (TGV) technique employing a GIP, a silicon substrate is stuck to one of the main surfaces of the GIP at a temperature of 200° C.-400° C., and a wiring board configured by forming wiring on a polyimide resin with copper or the like is stuck to the other main surface of the GIP. The silicon substrate and the wiring board are connected to each other with copper wires or the like through the through-hole of the glass substrate. An insulating layer may be formed on a surface of the glass substrate having a through-hole in order to prevent alkali component diffusion from the glass substrate.

A glass substrate according to one embodiment of the invention, when used as a GIP, is effective in reducing the residual strains which occur in the glass substrate, element substrate, wiring board, and wiring in heat treatment steps, since the glass substrate has an average coefficient of thermal expansion α1 at 50° C.-350° C. of 11-16 ppm/° C.

A glass substrate according to one embodiment of the invention may be used as a cap material of a high-frequency filter such as an SAW or FBAR filter.

The case where the glass substrate according to one embodiment of the invention is used as, for example, the cap material of an SAW filter is explained. The cap material is laminated to a piezoelectric substrate (e.g., $LiTaO_3$) so as to leave a space inside, thereby configuring a laminated substrate. The piezoelectric substrate has comb-shaped electrodes formed on one of the main surfaces thereof. The cap material is laminated to the piezoelectric substrate so that the comb-shaped electrodes are positioned in the space. A bonding material may be suitably disposed in a portion where the cap material is stuck to the piezoelectric substrate. Also in producing an SAW filter, a heat treatment is performed for forming, for example, wiring lines or solder bumps. $LiTaO_3$ single-crystal substrates, which are representative piezoelectric substrates, have an average coefficient of thermal expansion (average value along the ZX direction of the crystal) of about 12 ppm/° C. By using a glass substrate according to one embodiment of the invention as the cap material, the difference in thermal expansion coefficient can be reduced, making it possible to avoid deformations, damage, etc. due to a difference in thermal expansion coefficient. Especially in the case of SAW filters, a deformation of the laminated substrate may change the wiring line pitch of the comb-shaped electrodes and this change can cause defects such as, for example, impaired frequency characteristics. By applying a glass substrate according to one embodiment of the invention, product failures can be avoided and the reliability can be improved.

Second Embodiment

The glass substrate according to the second embodiment of the invention is a supporting substrate for semiconductor packages which has, as represented by mole percentage based on oxides, an $SiO_2$ content of 55%-75%, a $K_2O$ content of 5%-30%, and an $Li_2O$ content of 0%-5.0%; a value obtained by dividing an $Na_2O$ content by a value obtained by subtracting an $Al_2O_3$ content from a total content of $Na_2O$ and $K_2O$ is 0.90 or smaller; and an average coefficient of thermal expansion $\alpha 1$ at 50° C.-350° C. of 12.0 ppm/° C.-16 ppm/° C.

Due to the $\alpha 1$ regulated to a value within that range, this glass substrate can advantageously function as a supporting substrate even in cases where this glass substrate is stuck to a substrate having a higher coefficient of thermal expansion.

The glass substrate according to the second embodiment can be suitably combined with any of the configurations of the first embodiment. An explanation on specific configurations is omitted because the explanation on the first embodiment is applicable.

Third Embodiment

The glass substrate according to the third embodiment of the invention is a supporting substrate for semiconductor packages which has a Knoop hardness of 500 or less and an average coefficient of thermal expansion $\alpha 1$ at 50° C.-350° C. of 11 ppm/° C.-16 ppm/° C.

In the case where a glass substrate is used as a supporting substrate for semiconductor packages, the glass substrate is frequently required to have an optimal deviation of thickness from the standpoint of satisfactory sticking to an adherend. For regulating the thickness deviation of a glass substrate, processing such as grinding or polishing is performed. In the case of performing processing such as grinding or polishing, it is preferable that the glass substrate should have a low hardness. This is because lower glass-substrate hardnesses result in a higher processing rate to improve the throughput in the regulation of thickness deviation. Especially in the case of glass substrates having a high coefficient of thermal expansion, like a glass substrate according to one embodiment of the invention, lower hardnesses are preferred. In cases where a glass substrate having a high coefficient of thermal expansion is ground or polished under a higher load in order to heighten the processing rate, the temperature rises and thermal stress locally occurs, and this may result in cracking. Consequently, glass substrates having a high coefficient of thermal expansion preferably have a lower hardness (e.g., Knoop hardness or Vickers hardness).

By regulating the Knoop hardness to 500 or less, this glass substrate can be processed at a sufficiently high rate. The Knoop hardness thereof is more preferably 480 or less, even more preferably 460 or less. Meanwhile, too low Knoop hardnesses may arouse troubles, for example, that the glass substrate receives scratches and that the glass substrate chips and the fragments come into the process line to form scratches on succeeding glass substrates to cause a decrease in strength or an impaired appearance. Consequently, the Knoop hardness thereof is preferably 400 or higher, more preferably 420 or higher. In cases where the Knoop hardness is 400 or higher, this glass substrate can be less apt to suffer surface scratches.

The glass substrate according to the third embodiment can be suitably combined with any of the configurations of the first and/or second embodiments. For example, the glass substrate according to the third embodiment of the invention includes, as a glass matrix composition,
$SiO_2$: 55%-75%,
$Al_2O_3$: 2%-15%,
MgO: 0%-10%,
CaO: 0%-10%,
SrO: 0%-10%,
BaO: 0%-15%,
$ZrO_2$: 0%-5%,
$Na_2O$: 0%-20%,
$K_2O$: 5%-30%, and
$Li_2O$: 0%-5.0%.

Thus, this glass substrate has a high coefficient of thermal expansion and a sufficiently low Knoop hardness.

An explanation on specific configurations is omitted because the explanation on the first and second embodiments is applicable.

Fourth Embodiment

The glass substrate according to the fourth embodiment of the invention is a supporting substrate for semiconductor packages which has a photoelastic constant of 10-26 nm/cm/MPa and an average coefficient of thermal expansion $\alpha 1$ at 50° C.-350° C. of 11 ppm/° C.-16 ppm/° C.

The photoelastic constant C thereof is preferably 12 nm/cm/MPa or higher, more preferably 13 nm/cm/MPa or higher. Meanwhile, the photoelastic constant C thereof is preferably 25 nm/cm/MPa or less, more preferably 23 nm/cm/MPa or less, especially preferably 20 nm/cm/MPa.

By regulating the photoelastic constant C to 10 nm/cm/MPa or higher, this glass substrate can be inhibited from being bent by its own weight. As a result, this glass substrate, when used as a supporting substrate for semiconductor packages, can be prevented from arousing troubles due to the bending in conveying steps. In cases where the photoelastic constant C thereof is 10 nm/cm/MPa or higher, there is no need of incorporating SrO, BaO, or the like in too large an amount and, hence, this glass can be prevented from having too high a specific gravity and arousing troubles such as bending due to its own weight. In addition, this glass can be prevented from having enhanced devitrification properties.

By regulating the photoelastic constant C to 26 nm/cm/MPa or less, birefringence can be sufficiently reduced. Specifically, in cases where the photoelastic constant C is 26 nm/cm/MPa or less, this glass substrate can have sufficiently low birefringence even in the case where stress has occurred in the glass substrate because of a difference in thermal expansion coefficient between the glass substrate and a resin or where the glass substrate has residual stress. In particular, glass substrates having a coefficient of thermal expansion as high as 11 ppm/° C. or above have the possibility of having higher residual stress or coming to have higher thermal stress than glass substrates having a low coefficient of thermal expansion. It is therefore preferable that glass substrates having a coefficient of thermal expansion as high as 11 ppm/° C. or above should be made to have a lower photoelastic constant than glass substrates having a low coefficient of thermal expansion, in order to sufficiently reduce the birefringence. By sufficiently reducing the birefringence, failures can be prevented from occurring in steps for irradiation with laser light, which is coherent light (steps for accurate thickness measurement and for separation).

The glass substrate according to the fourth embodiment can be suitably combined with any of the configurations of the first, second and/or third embodiments. For example, the glass substrate according to the fourth embodiment of the invention includes, as a glass matrix composition,
$SiO_2$: 55%-75%,
$Al_2O_3$: 2%-15%,
MgO: 0%-10%, CaO: 0%-10%,
SrO: 0%-10%,
BaO: 0%-15%,
$ZrO_2$: 0%-5%,
$Na_2O$: 0%-20%,
$K_2O$: 5%-30%, and
$Li_2O$: 0%-5.0%.

Thus, this glass substrate has a high coefficient of thermal expansion and a photoelastic constant within a preferable range.

An explanation on specific configurations is omitted because the explanation on the first, second and third embodiments is applicable.

EXAMPLES

The present invention is explained below in detail by reference to Examples, but the invention is not limited to the following Examples. Examples 1 to 10, 12 to 17, and 19 to 24 are Examples according to the first embodiment, and Examples 11, 18, and 25 are Comparative Examples for the first embodiment. Examples 1 to 10, 12, 15 to 17, and 19 to 24 are Examples according to the second embodiment, and Examples 11, 18, and 25 are Comparative Examples for the second embodiment. Examples 13 to 15, 17, and 21 to 24 are Examples according to the third embodiment, and Example 25 is a Comparative Example for the third embodiment. Examples 14, 18, 22, and 23 are Examples according to the fourth embodiment, and Example 25 is a Comparative Example for the fourth embodiment.

Various raw glass materials including silica sand were prepared so as to result in each of the glass compositions shown in Table 1 and Table 2. A sulfate was added to the raw materials mixed together so as to result in each desired composition, in an amount of 0.1-1% in terms of $SO_3$ amount on an oxide basis in % by mass, and Cl was added thereto in an amount of 0.1-1%, the amount of the raw materials being taken as 100%. Using a platinum crucible, each resultant mixture was melted by heating at a temperature of 1,550-1,650° C. for 3 hours.

During the melting, a platinum stirrer was inserted to stir the melt for 1 hour to homogenize the glass. The molten glass was subsequently poured and formed into a plate shape. This plate-shaped glass was introduced into an electric furnace having a temperature higher by about 50° C. than the Tg, and the temperature of the electric furnace was maintained for 1 hour and then lowered at a cooling rate of 1° C./min until the glass was cooled to room temperature.

The glasses obtained were examined for the average coefficient of thermal expansion at 50° C.-350° C. (unit: ppm/° C.), average coefficient of thermal expansion at 30° C.-220° C. (unit: ppm/° C.), density (unit: g/cm³), Young's modulus (unit: GPa), Tg (unit: ° C.), $T_4$ (unit: ° C.), $T_2$ (unit: ° C.), and devitrification temperature (unit: ° C.). The results thereof are shown in Table 1 and Table 2. The methods used for determining the properties are shown below.

(Average Coefficient of Thermal Expansion)
A differential dilatometer (TMA) was used to make a measurement in accordance with the method as provided for in JIS R3102 (year 1995). The measurement was made over the temperature ranges of 50° C.-350° C. and 30° C.-220° C.

(Density)
Glass masses weighing about 20 g and containing no bubbles were examined by Archimedes' method to determine the density.

(Young's Modulus)
A glass having a thickness of 0.5-10 mm was examined for Young's modulus by an ultrasonic pulse method.

(Tg)
A TMA was used to measure the Tg in accordance with the method as provided for in JIS R3103-3 (year 2001).

($T_4$), ($T_2$)
A rotational viscometer was used to measure the viscosity to determine the temperature $T_4$ (° C.) at which the viscosity was $10^4$ d·Pa·s. Furthermore, the temperature $T_2$ (° C.) at which the viscosity was $10^2$ d·Pa·s was determined.

(Devitrification Temperature)
Crushed particles of a glass were placed on a platinum dish and heat-treated for 17 hours in an electric furnace controlled so as to have a constant temperature. The heat-treated glass was examined with an optical microscope to determine a highest temperature at which crystal precipitation occurred in neither the glass surface nor the inside thereof. The highest temperature was taken as the devitrification temperature.

(Knoop Hardness)
A mirror-polished glass was used as a sample and tested at a test force of 100 gf (0.9807 N) in accordance with JIS Z2251:2009 to measure the Knoop hardness.

(Photoelastic Constant)
A measurement was made by the disk compression method described in Yõgyõ Kyõkai-shi, Vol. 87, No. 10 (1979), p. 519.

TABLE 1

| | | 1 | 2 | 3 | 4 | 5 | 6 | 7 |
|---|---|---|---|---|---|---|---|---|
| Composition (mol %) | $SiO_2$ | 65.0 | 65.0 | 65.0 | 63.0 | 65.0 | 65.0 | 65.0 |
| | $Al_2O_3$ | 5.0 | 5.0 | 5.0 | 7.0 | 5.0 | 5.0 | 5.0 |
| | MgO | 0 | 0 | 0 | 0 | 0 | 0 | 0 |
| | CaO | 0 | 0 | 0 | 0 | 0 | 0 | 2.5 |
| | SrO | 5.0 | 0 | 2.5 | 0 | 0 | 0 | 0.0 |
| | BaO | 5.0 | 5.0 | 2.5 | 5.0 | 5.0 | 5.0 | 2.5 |
| | $ZrO_2$ | 0 | 0 | 0 | 0 | 1 | 0 | 1 |
| | $Na_2O$ | 0 | 5.0 | 5.0 | 5.0 | 5.0 | 15.0 | 5.0 |
| | $K_2O$ | 20.0 | 20.0 | 20.0 | 20.0 | 19.0 | 10.0 | 19.0 |
| | $Li_2O$ | 0 | 0 | 0 | 0 | 0 | 0 | 0 |
| $R_2O$ | | 20.0 | 25.0 | 25.0 | 25.0 | 24.0 | 25.0 | 24.0 |
| $R_2O/SiO_2$ | | 0.31 | 0.31 | 0.31 | 0.32 | 0.31 | 0.15 | 0.31 |
| $Na_2O/(Na_2O + K_2O - Al_2O_3)$ | | 0.00 | 0.25 | 0.25 | 0.28 | 0.26 | 0.75 | 0.26 |
| Average coefficient of thermal expansion (ppm/° C.) | 50-350° C. | 12.1 | 14.4 | 14.0 | 13.8 | 13.5 | 14.0 | 13.2 |
| Average coefficient of thermal expansion (ppm/° C.) | 30-220° C. | 11.7 | 13.6 | 13.3 | 13.1 | 12.9 | 13.1 | 12.7 |

TABLE 1-continued

|  |  |  |  |  |  |  |  |
|---|---|---|---|---|---|---|---|
| Density (g/cm³) | 2.717 | 2.640 | 2.606 | 2.644 | 2.663 | 2.659 | 2.596 |
| Young's modulus (GPa) | 61 | 62 | 64 | 63 | 63 | 66 | 66 |
| Knoop hardness |  |  |  |  |  |  |  |
| Photoelastic constant |  |  |  |  |  |  |  |
| $T_g$ (° C.) | 582 | 490 | 498 | 506 | 502 | 460 | 523 |
| $T_2$ (° C.) |  |  |  | 1462 | 1438 | 1368 | 1446 |
| $T_4$ (° C.) |  |  |  | 1034 | 1029 | 940 | 1039 |
| Devitrification temperature (° C.) |  | <1050 |  | <1000 | <1100 | <930 | <1100 |

|  |  |  | 8 | 9 | 10 | 11 | 12 |
|---|---|---|---|---|---|---|---|
| Composition (mol %) | SiO₂ |  | 65.0 | 65.0 | 65.0 | 62.0 | 70.0 |
|  | Al₂O₃ |  | 5.0 | 5.0 | 5.0 | 2.0 | 5.0 |
|  | MgO |  | 0 | 0 | 0 | 0 | 0 |
|  | CaO |  | 5.0 | 4.5 | 4.0 | 0 | 0 |
|  | SrO |  | 0 | 0 | 0 | 12.0 | 0 |
|  | BaO |  | 0 | 0 | 0 | 17.0 | 0 |
|  | ZrO₂ |  | 0 | 0.5 | 1.0 | 0 | 0 |
|  | Na₂O |  | 5.0 | 5.0 | 5.0 | 5.0 | 5.0 |
|  | K₂O |  | 20.0 | 20.0 | 20.0 | 2.0 | 20.0 |
|  | Li₂O |  | 0 | 0 | 0 | 0 | 0 |
| R₂O |  |  | 25.0 | 25.0 | 25.0 | 7.0 | 25.0 |
| R₂O/SiO₂ |  |  | 0.31 | 0.32 | 0.32 | 0.03 | 0.29 |
| Na₂O/(Na₂O + K₂O − Al₂O₃) |  |  | 0.25 | 0.25 | 0.25 | 1.00 | 0.25 |
| Average coefficient of thermal expansion (ppm/° C.) | 50-350° C. |  | 13.5 | 13.5 | 13.1 | 10.3 | 14.2 |
| Average coefficient of thermal expansion (ppm/° C.) | 30-220° C. |  | 13.0 | 12.9 | 12.7 | 9.7 | 13.8 |
| Density (g/cm³) |  |  | 2.504 |  |  | 3.44 | 2.453 |
| Young's modulus (GPa) |  |  | 65 |  |  |  |  |
| Knoop hardness |  |  |  |  |  |  |  |
| Photoelastic constant |  |  |  |  |  |  |  |
| $T_g$ (° C.) |  |  | 531 |  |  | 534 | 495 |
| $T_2$ (° C.) |  |  | 1435 |  |  |  |  |
| $T_4$ (° C.) |  |  | 1020 |  |  |  |  |
| Devitrification temperature (° C.) |  |  | <980 | <980 | <1100 |  | <980 |

TABLE 2

|  |  | 13 | 14 | 15 | 16 | 17 | 18 | 19 |
|---|---|---|---|---|---|---|---|---|
| Composition (mol %) | SiO₂ | 60.0 | 60.0 | 60.0 | 65.0 | 60.0 | 60.0 | 60.0 |
|  | Al₂O₃ | 4.0 | 2.0 | 4.0 | 10.0 | 6.0 | 2.0 | 2.0 |
|  | MgO | 5.0 | 5.0 | 5.0 | 0 | 5.0 | 0 | 5.0 |
|  | CaO | 2.0 | 0 | 0 | 0 | 1.0 | 0 | 2.0 |
|  | SrO | 5.0 | 5.0 | 5.0 | 0 | 2.0 | 5.0 | 9.0 |
|  | BaO | 4.0 | 6.0 | 3.0 | 0 | 1.0 | 24.0 | 2.0 |
|  | ZrO₂ | 0 | 2.0 | 1.0 | 0 | 1.0 | 0 | 0 |
|  | Na₂O | 10.0 | 10.0 | 11.0 | 5.0 | 12.0 | 2.0 | 10.0 |
|  | K₂O | 10.0 | 10.0 | 11.0 | 20.0 | 12.0 | 7.0 | 10.0 |
|  | Li₂O | 0 | 0 | 0 | 0 | 0 | 0 | 0 |
| R₂O |  | 20.0 | 20.0 | 22.0 | 25.0 | 24.0 | 9.0 | 20.0 |
| R₂O/SiO₂ |  | 0.17 | 0.20 | 0.20 | 0.31 | 0.22 | 0.12 | 0.17 |
| Na₂O/(Na₂O + K₂O − Al₂O₃) |  | 0.63 | 0.56 | 0.61 | 0.33 | 0.67 | 0.29 | 0.56 |
| Average coefficient of thermal expansion (ppm/° C.) | 50-350° C. | 11.90 | 11.8 | 12.2 | 12.8 | 12.3 | 11.6 | 12.2 |
| Average coefficient of thermal expansion (ppm/° C.) | 30-220° C. | 11.6 | 11.7 | 11.9 | 12.6 | 12.1 | 11.1 | 12.0 |
| Density (g/cm³) |  | 2.760 | 2.890 | 2.736 | 2.465 | 2.604 | 3.438 | 2.789 |
| Young's modulus (GPa) |  | 72 | 72 | 70 |  |  | 68 | 72 |
| Knoop hardness |  | 450 | 460 | 460 |  | 450 |  |  |
| Photoelastic constant |  |  | 21.7 |  |  |  | 17.5 |  |
| $T_g$ (° C.) |  | 495 | 491 | 490 | 545 | 483 | 566 | 485 |
| $T_2$ (° C.) |  | 1333 | 1296 | 1337 |  | 1405 | 1287 |  |
| $T_4$ (° C.) |  | 959 | 957 | 965 |  | 1011 | 997 |  |
| Devitrification temperature (° C.) |  | 920-940 | 1010< | 1000< |  | 1000< | 1150-1200 | 1020-1040 |

|  |  | 20 | 21 | 22 | 23 | 24 | 25 |
|---|---|---|---|---|---|---|---|
| Composition (mol %) | SiO₂ | 60.0 | 60.0 | 60.0 | 60.0 | 60.0 | 71.1 |
|  | Al₂O₃ | 2.0 | 4.0 | 2.0 | 4.0 | 4.0 | 1.1 |
|  | MgO | 0 | 5.0 | 5.0 | 5.0 | 7.0 | 6.9 |
|  | CaO | 0 | 2.0 | 0 | 0 | 0 | 8.3 |
|  | SrO | 5.0 | 5.0 | 5.0 | 5.0 | 5.0 | 0 |
|  | BaO | 15.0 | 2.0 | 10.0 | 6.0 | 2.0 | 0 |
|  | ZrO₂ | 0 | 0 | 0 | 0 | 0 | 0 |

TABLE 2-continued

|  |  |  |  |  |  |  |  |
|---|---|---|---|---|---|---|---|
| $Na_2O$ |  | 9.0 | 11.0 | 9.0 | 10.0 | 11.0 | 12.4 |
| $K_2O$ |  | 9.0 | 11.0 | 9.0 | 10.0 | 11.0 | 0.2 |
| $Li_2O$ |  | 0 | 0 | 0 | 0 | 0 | 0 |
| $R_2O$ |  | 18.0 | 22.0 | 18.0 | 20.0 | 22.0 | 12.6 |
| $R_2O/SiO_2$ |  | 0.15 | 0.18 | 0.15 | 0.17 | 0.18 | 0.00 |
| $Na_2O/(Na_2O + K_2O - Al_2O_3)$ |  | 0.56 | 0.61 | 0.56 | 0.63 | 0.61 | 1.08 |
| Average coefficient of thermal expansion (ppm/° C.) | 50-350° C. | 13.2 | 12.7 | 12.4 | 12.4 | 12.6 | 8.8 |
| Average coefficient of thermal expansion (ppm/° C.) | 30-220° C. | 12.8 | 12.3 | 12.1 | 12.0 | 12.1 | 8.6 |
| Density (g/cm$^3$) |  | 3.166 | 2.692 | 2.973 | 2.828 | 2.685 | 2.495 |
| Young's modulus (GPa) |  | 74 | 71 | 69 | 70 |  | 72 |
| Knoop hardness |  |  | 450 | 440 | 440 | 440 | 520 |
| Photoelastic constant |  |  |  | 19.9 | 22.8 |  | 27.1 |
| $T_g$ (° C.) |  | 485 | 488 | 475 | 488 | 467 | 550 |
| $T_2$ (° C.) |  |  |  | 1244 | 1319 | 1331 | 1471 |
| $T_4$ (° C.) |  |  |  | 906 | 947 | 950 | 1039 |
| Devitrification temperature (° C.) |  |  |  | 920-930 | <940 | 940-960 |  |

Examples 1 to 10, 12 to 17, and 19 to 24 were each found to have a sufficiently high coefficient of thermal expansion. Examples 1 to 10, 12, 15 to 17, and 19 to 24 were each found to have an even higher coefficient of thermal expansion and be more suitable for use as a supporting substrate for semiconductor packages. Examples 13 to 15, 17, and 21 to 24 were each found to have a Knoop hardness which rendered the glass substrate suitable for use as a supporting substrate for semiconductor packages. Examples 14, 18, 22, and 23 were each found to have a photoelastic constant which rendered the glass substrate suitable for use as a supporting substrate for semiconductor packages.

INDUSTRIAL APPLICABILITY

Glass substrates according to embodiments of the invention are usable, for example, as a supporting glass substrate for fan-out type wafer-level packages, a glass substrate for image sensors for which an element size reduction by wafer-level packaging is effective, such as MEMSs, CMOSs, and CISs, a glass substrate having a through-hole (glass interposer; GIP), a cap material for high-frequency filters such as SAW and FBAR filters, and a support glass for semiconductor back grinding. In particular, the glass substrates are suitable for use as supporting glass substrates for fan-out type wafer-level packages.

While the invention has been described in detail and with reference to specific embodiments thereof, it will be apparent to one skilled in the art that various changes and modifications can be made therein without departing from the spirit and scope thereof. This application is based on a Japanese patent application filed on Dec. 28, 2015 (Application No. 2015-255887), a Japanese patent application filed on Jul. 28, 2016 (Application No. 2016-148677), and a Japanese patent application filed on Sep. 14, 2016 (Application No. 2016-179816), the contents thereof being incorporated herein by reference.

DESCRIPTION OF THE REFERENCE NUMERALS AND SINGS

G1, G100 Glass substrate
10, 110 Element substrate
20, 120, 122 Holding layer
30, 130, 150 Laminated substrate
102 Semiconductor chip
104 Encapsulating material
G140 Second supporting substrate

The invention claimed is:

1. A glass substrate comprising, as a glass matrix composition as represented by mole percentage based on oxides,
    from 55% to 75% of $SiO_2$,
    from 2% to 15% of $Al_2O_3$,
    from 0% to 10% of MgO,
    from 0% to 10% of CaO,
    from 0.5% to 10% of SrO,
    from 0% to 15% of BaO,
    from 0% to 5% of $ZrO_2$,
    from 0% to 20% of $Na_2O$,
    from 5% to 30% of $K_2O$, and
    from 0% to 5% of $Li_2O$,
    wherein:
        a total content of alkali metal oxides ($R_2O$), as represented by mole percentage based on oxides, is from 10% to 23%;
        a total content of MgO, CaO, SrO, and BaO is from 4% to 20%;
        a value obtained by dividing a total content of alkali metal oxides by the content of $SiO_2$ of 0.50 or smaller;
        a value obtained by dividing the content of $Na_2O$ by a value obtained by subtracting the content of $Al_2O_3$ from a total content of $Na_2O$ and $K_2O$ of 0.90 or smaller; and
        an average coefficient of thermal expansion α1 at 50° C. to 350° C. of from 11 ppm/° C. to 16 ppm/° C., and
    wherein the glass substrate contains substantially no ZnO.

2. The glass substrate according to claim 1, which has a value determined by the following expression (1) which represents a relationship among the contents of oxides of from 110 to 160:

$$0.507 \times (\text{content of SiO}_2) - 1.112 \times (\text{content of Al}_2\text{O}_3) + 0.709 \times (\text{content of MgO}) + 0.534 \times (\text{content of CaO}) - 0.108 \times (\text{content of SrO}) + 1.832 \times (\text{content of BaO}) + 4.083 \times (\text{content of Na}_2\text{O}) + 4.449 \times (\text{content of K}_2\text{O}) - 4.532 \times (\text{content of ZrO}_2) \quad (1).$$

3. The glass substrate according to claim 1, which has a value determined by the following expression (1) which represents a relationship among the contents of oxides of from 100 to 150:

$$1.135 \times (\text{content of SiO}_2) - 0.741 \times (\text{content of Al}_2\text{O}_3) + 2.080 \times (\text{content of MgO}) + 0.293 \times (\text{content of CaO}) - 1.307 \times (\text{content of SrO}) + 1.242 \times (\text{content of BaO}) + 2.056 \times (\text{content of Na}_2\text{O}) + 2.464 \times (\text{content of K}_2\text{O}) - 2.982 \times (\text{content of ZrO}_2) \quad (2).$$

4. The glass substrate according to claim 1, which has a content of $Fe_2O_3$, as represented by mass per million based on oxides, of 1,000 ppm or less.

5. The glass substrate according to claim 1, having a Knoop hardness of 500 or less.

6. The glass substrate of claim 1, having a Knoop hardness of 500 or less; wherein the glass substrate is a supporting substrate for semiconductor packages.

7. The glass substrate according to claim 1, having a photoelastic constant C of from 10 to 26 nm/cm/MPa.

8. The glass substrate of claim 1, having a photoelastic constant C of from 10 to 26 nm/cm/MPa; wherein the glass substrate is a supporting substrate for semiconductor packages.

9. The glass substrate according to claim 1, having an average coefficient of thermal expansion α2 at 30° C. to 220° C. of from 10 ppm/° C. to 15 ppm/° C.

10. The glass substrate according to claim 1, which has a devitrification temperature lower than 1,150° C.

11. The glass substrate according to claim 1, which has a Young's modulus of 60 GPa or higher.

12. The glass substrate according to claim 1, which has a β-OH of from 0.05 to 0.65 $mm^{-1}$.

13. The glass substrate according to claim 1, which is a supporting substrate for semiconductor packages.

14. The glass substrate according to claim 1, which is a glass substrate for fan-out type wafer-level packages, a cap material for high-frequency filters, or a support glass for semiconductor back grinding.

15. A laminated substrate comprising:
the glass substrate according to claim 1 and
an element substrate comprising semiconductor chips embedded in an encapsulating material, wherein the element substrate is laminated on the glass substrate.

16. A laminate comprising:
the glass substrate of claim 1 and
another glass substrate laminated on the glass substrate of claim 1.

17. A process for production of a semiconductor package, the process comprising:
forming an element substrate comprising a plurality of semiconductor chips embedded in an encapsulating material is formed over a first supporting substrate, thereby forming a first laminated substrate;
separating the first laminated substrate into the first supporting substrate and the element substrate;
laminating the element substrate separated from the first supporting substrate to a second supporting substrate, thereby forming a second laminated substrate;
forming a wiring line on a surface of the element substrate on a side opposite to the second supporting substrate;
separating the second laminated substrate into the second supporting substrate and the element substrate having the wiring line; and
dividing the element substrate separated from the second supporting substrate into chips respectively the plurality of semiconductor chips of the element substrate,
wherein the first supporting substrate, the second supporting substrate, or a combination thereof is/are the glass substrate of claim 1.

18. A glass substrate comprising, as represented by mole percentage based on oxides, from 55% to 75% of $SiO_2$, from 5% to 30% of $K_2O$, and from 0% to 5% of $Li_2O$;
wherein
a value obtained by dividing an $Na_2O$ content by a value obtained by subtracting an $Al_2O_3$ content from a total content of $Na_2O$ and $K_2O$ is 0.90 or smaller; and
an average coefficient of thermal expansion a1 at 50° C. to 350° C. is from 12.0 ppm/° C. to 16 ppm/° C., and
the glass substrate is a supporting substrate for semiconductor packages, and
wherein the glass substrate contains substantially no ZnO.

19. The glass substrate according to claim 18, comprising, as a glass matrix composition as represented by mole percentage based on oxides,
from 55% to 75% of $SiO_2$,
from 2% to 15% of $Al_2O_3$,
from 0% to 10% of MgO,
from 0% to 10% of CaO,
from 0.5% to 10% of SrO,
from 0% to 15% of BaO,
from 0% to 5% of $ZrO_2$,
from 0% to 20% of $Na_2O$,
from 5% to 30% of $K_2O$, and
from 0% to 5% of $Li_2O$.

20. The glass substrate according to claim 18, having a total content of alkali metal oxides ($R_2O$), as represented by mole percentage based on oxides, of from 10% to 23%.

21. The glass substrate according to claim 18, having a value obtained by dividing a total content of alkali metal oxides by the content of $SiO_2$ of 0.50 or smaller.

22. The glass substrate according to claim 18, wherein the glass substrate is a supporting substrate for semiconductor packages.

* * * * *